(12) United States Patent
Ichinoseki et al.

(10) Patent No.: US 12,396,208 B2
(45) Date of Patent: Aug. 19, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kentaro Ichinoseki, Higashimurayama Tokyo (JP); Keiko Kawamura, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 382 days.

(21) Appl. No.: 17/893,882

(22) Filed: Aug. 23, 2022

(65) Prior Publication Data
US 2023/0290875 A1 Sep. 14, 2023

(30) Foreign Application Priority Data

Mar. 11, 2022 (JP) .................. 2022-038212

(51) Int. Cl.
*H10D 30/66* (2025.01)
*H10D 64/00* (2025.01)
*H10D 64/27* (2025.01)

(52) U.S. Cl.
CPC ......... *H10D 30/668* (2025.01); *H10D 64/117* (2025.01); *H10D 64/513* (2025.01); *H10D 64/519* (2025.01)

(58) Field of Classification Search
CPC .. H10D 30/668; H10D 64/513; H10D 64/519; H10D 64/117
See application file for complete search history.

(56) References Cited

U.S. PATENT DOCUMENTS 8,558,308 B1 10/2013 Blank et al.
9,991,378 B2 6/2018 Li et al.
(Continued)

FOREIGN PATENT DOCUMENTS

JP 2006-210869 A 8/2006
JP 2019-145633 A 8/2019
(Continued)

OTHER PUBLICATIONS

Japanese Office Action mailed Mar. 19, 2025 in corresponding U.S. Patent Application 2022-038212 with English Translation, 12 pages.
(Continued)

*Primary Examiner* — Michael Lebentritt
(74) *Attorney, Agent, or Firm* — Kim & Stewart LLP

(57) ABSTRACT

A semiconductor device includes a semiconductor part, first to third electrodes, a control electrode and first to third insulating films. The semiconductor part is provided between the first and second electrodes. The third electrode extends in a first direction inside a trench of the semiconductor part. The control electrode is provided inside the trench at an opening side thereof. The control electrode includes first and second control portions arranged in a second direction crossing the first direction. The third electrode has an end portion between the first and second control portions. The first insulating film is provided between the semiconductor part and the third electrode. The second insulating film is provided between the semiconductor part and the control electrode. The third insulating film covers the end portion of the third electrode. The first insulating film includes an extending portion extending between the third insulating film and the control electrode.

11 Claims, 7 Drawing Sheets

(56) References Cited

U.S. PATENT DOCUMENTS

| | | |
|---|---|---|
| 10,763,352 B2 | 9/2020 | Matsuba et al. |
| 12,183,782 B2* | 12/2024 | Motai .................. H10D 12/481 |
| 2003/0047768 A1 | 3/2003 | Disney |
| 2005/0133858 A1 | 6/2005 | Banerjee |
| 2005/0167749 A1 | 8/2005 | Disney |
| 2016/0322489 A1 | 11/2016 | Siemieniec et al. |
| 2019/0259873 A1 | 8/2019 | Yamanobe et al. |
| 2020/0295150 A1 | 9/2020 | Nishiwaki et al. |
| 2021/0074848 A1* | 3/2021 | Katou ................. H01L 29/7813 |
| 2021/0202736 A1 | 7/2021 | Nishiguchi |
| 2021/0288176 A1* | 9/2021 | Tomita .................. H01L 29/407 |
| 2021/0296454 A1 | 9/2021 | Fujino |
| 2022/0077293 A1* | 3/2022 | Shimomura ...... H01L 29/66734 |
| 2022/0285548 A1* | 9/2022 | Katou ................. H10D 64/518 |
| 2023/0085921 A1* | 3/2023 | Matsushita ......... H01L 29/7397 |
| | | 257/565 |
| 2023/0299076 A1* | 9/2023 | Itokazu ................ H10D 62/393 |
| | | 257/140 |

FOREIGN PATENT DOCUMENTS

| | | |
|---|---|---|
| JP | 2019-145701 A | 8/2019 |
| JP | 2020-150185 A | 9/2020 |
| JP | 2021-106179 A | 7/2021 |
| JP | 2021-150401 A | 9/2021 |

OTHER PUBLICATIONS

Japanese Office Action mailed Mar. 19, 2025 in corresponding Japanese Patent Application 2022-038212 with English Translation, 12 pages.

* cited by examiner

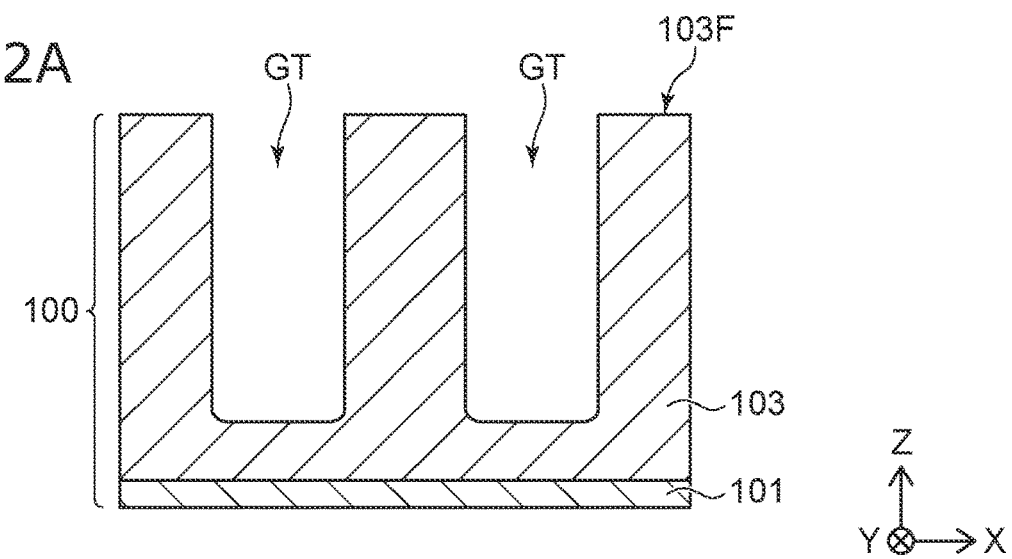
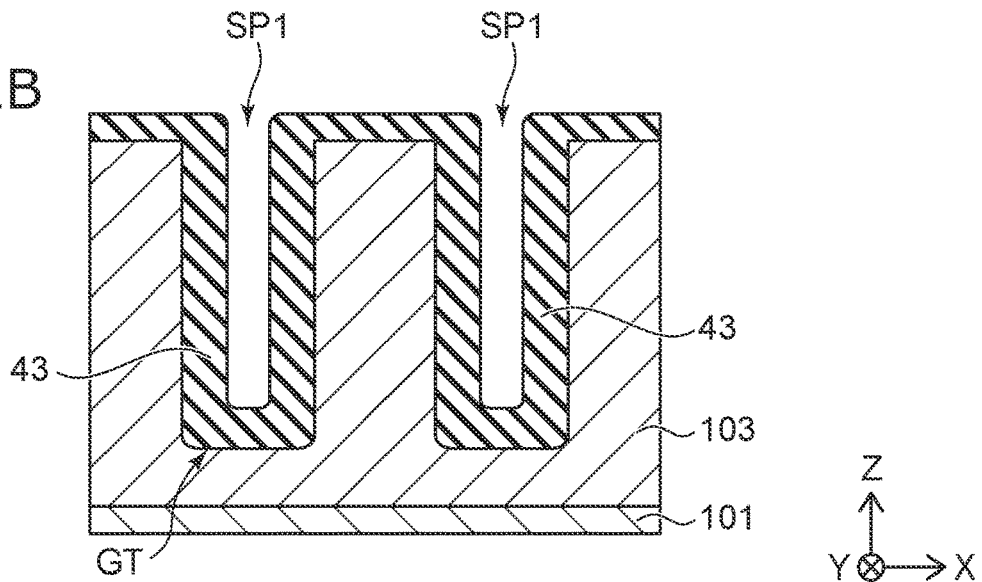
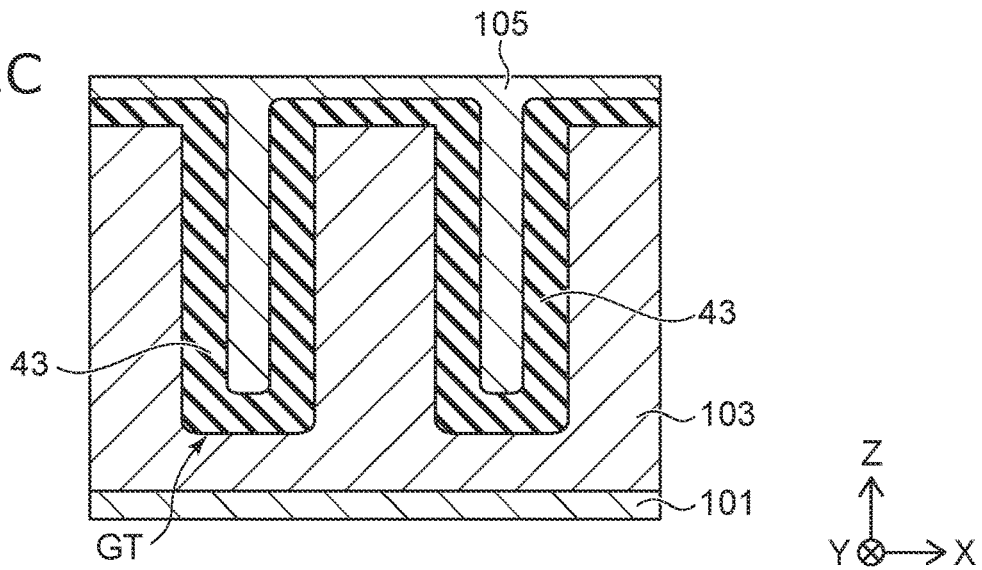

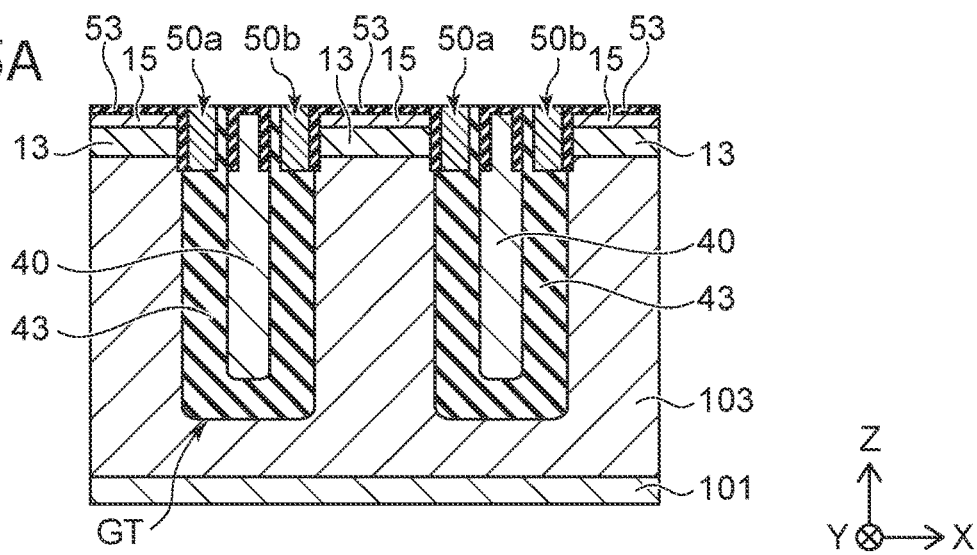
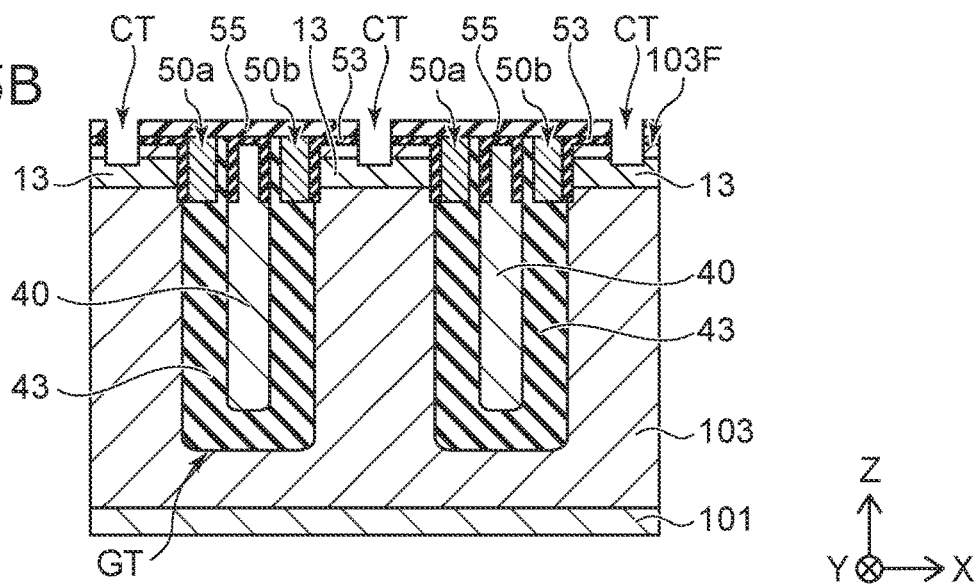
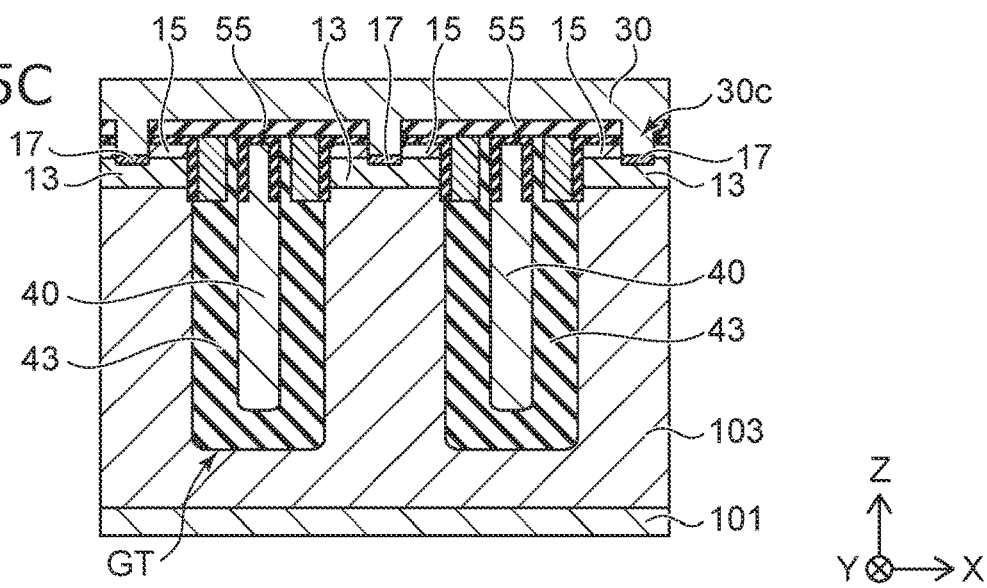

SEMICONDUCTOR DEVICE

CROSS-REFERENCE TO RELATED APPLICATIONS

This application is based upon and claims the benefit of priority from Japanese Patent Application No. 2022-038212, filed on Mar. 11, 2022; the entire contents of which are incorporated herein by reference.

FIELD

Embodiments relate to a semiconductor device.

BACKGROUND

A semiconductor device is required to improve reliability. Some trench-gate-type MOSFETs, for example, have a structure in which a field plate is disposed inside a gate trench. In such a semiconductor device, it is desirable to increase a dielectric breakdown voltage of an insulating film that electrically insulates a gate electrode from the field plate.

BRIEF DESCRIPTION OF THE DRAWINGS

FIGS. 2A to 5C are schematic cross-sectional views showing manufacturing processes of the semiconductor device according to the embodiment;

DETAILED DESCRIPTION

Figure 1:
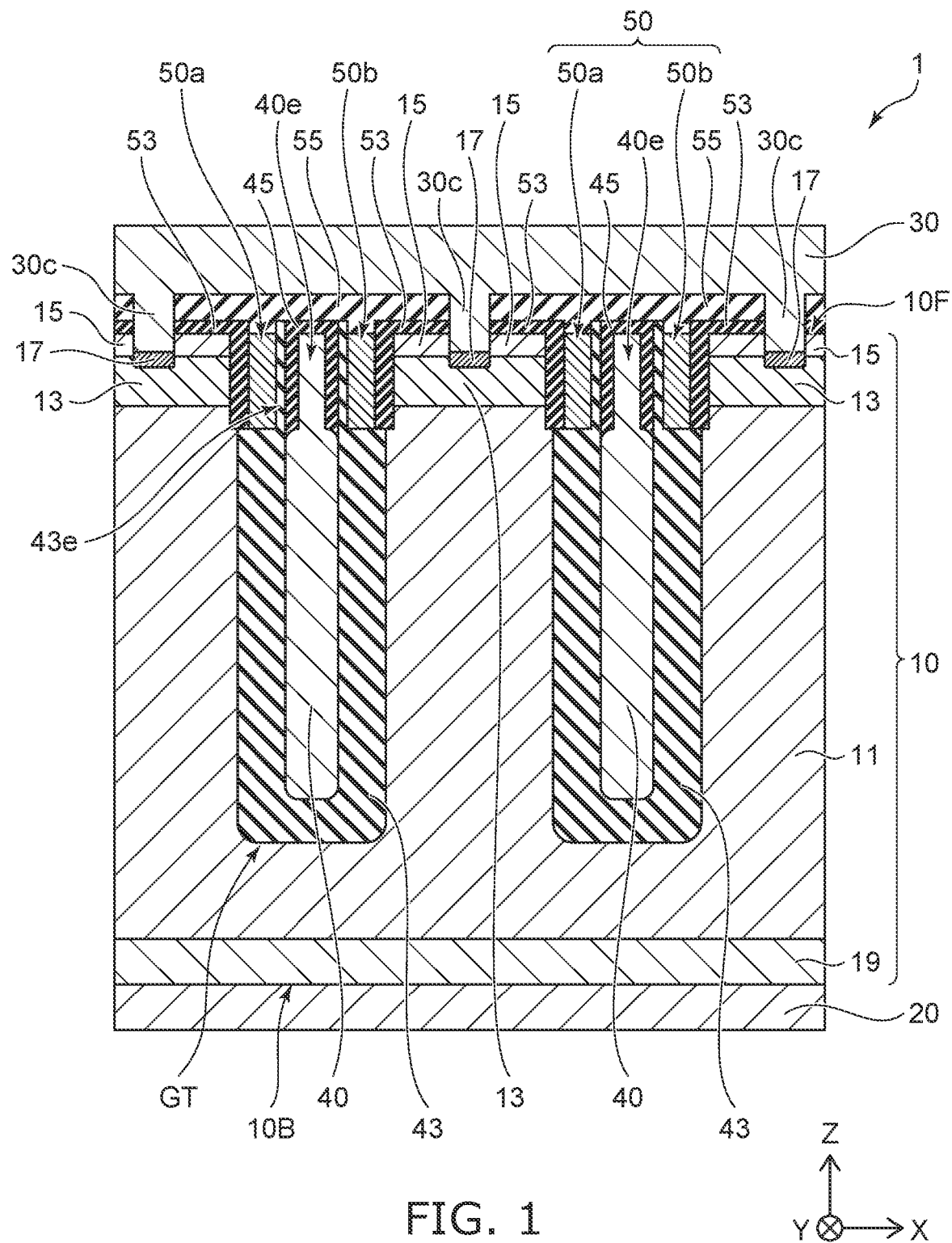
FIG. 1 is a schematic cross-sectional view showing a semiconductor device according to the embodiment.

According to one embodiment, a semiconductor device includes a semiconductor part, first to third electrodes, a control electrode and first to third insulating films. The first electrode being provided on a back surface of the semiconductor part. The second electrode being provided on a front surface of the semiconductor part. The front surface is at a side opposite to the back surface. The third electrode is provided between the first electrode and the second electrode. The semiconductor part includes a trench having an opening in the front surface. The third electrode extends inside the trench in a first direction from the first electrode toward the second electrode. The control electrode is provided inside the trench at the opening side. The control electrode includes a first control portion and a second control portion arranged in a second direction parallel to the back surface of the semiconductor part. The third electrode has an end portion extending between the first control portion and the second control portion. The first insulating film is provided between the semiconductor part and the third electrode. The first insulating film electrically insulates the third electrode from the semiconductor part. The second insulating film is provided between the semiconductor part and the control electrode. The second insulating film electrically insulates the control electrode from the semiconductor part. The third insulating film covers the end portion of the third electrode. The third insulating film electrically insulates the third electrode from the control electrode. The control electrode is provided between the first insulating film and the second electrode. The first insulating film includes an extending portion extending between the end portion of the third electrode and the control electrode. The third insulating film extends between the extending portion of the first insulating film and the end portion of the third electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to the embodiment. The semiconductor device 1 is, for example, a power MOSFET. The semiconductor device 1 includes, for example, a semiconductor part 10, a drain electrode 20, a source electrode 30, a field plate electrode (hereinafter, referred to as a FP electrode 40), and a gate electrode 50.

The semiconductor part 10 is, for example, silicon. The semiconductor part 10 has a back surface 10B and a front surface 10F on a side opposite to the back surface 10B. The drain electrode 20 (a first electrode) is provided on the back surface 10B of the semiconductor part 10. The source electrode 30 (a second electrode) is provided on the front surface 10F of the semiconductor part 10. The FP electrode 40 is provided inside the semiconductor part 10 and between the drain electrode 20 and the source electrode 30.

The semiconductor part 10 includes, for example, an n-type drift layer 11, a p-type base layer 13, an n-type source layer 15, a p-type contact layer 17, and an n-type buffer layer 19. Hereinafter, a first conductivity type is described as an n-type, and a second conductivity type is described as a p-type.

The n-type drift layer 11 (a first layer) extends between the drain electrode 20 and the source electrode 30. The p-type base layer 13 (a second layer) is provided between the n-type drift layer 11 and the source electrode 30. The n-type source layer 15 (a third layer) is provided between the p-type base layer 13 and the source electrode 30.

The semiconductor part 10 includes a gate trench GT. The gate trench GT has an opening in the front surface 10F of the semiconductor part 10 (see FIG. 2A). The gate trench GT has a depth capable of reaching the n-type drift layer 11. The gate trench GT extends from the front surface 10F of the semiconductor part 10 into the n-type drift layer 11. The FP electrode 40 and the gate electrode 50 are provided inside the gate trench GT.

The FP electrode 40 (a third electrode) extends in a first direction inside the gate trench GT. The first direction is, for example, a Z-direction directed from the drain electrode 20 toward the source electrode 30. The FP electrode 40 is electrically insulated from the semiconductor part 10 by a field plate insulating film 43 (a first insulating film). The field plate insulating film 43 (hereinafter, referred to as an FP insulating film 43) is provided between the semiconductor part 10 and the FP electrode 40. The FP electrode 40 faces the n-type drift layer 11 via the FP insulating film 43.

The gate electrode 50 (a control electrode) is provided at an opening side of the gate trench GT. The gate electrode 50 is electrically insulated from the semiconductor part 10 by a gate insulating film 53 (a second insulating film). The gate insulating film 53 is provided between the semiconductor part 10 and the gate electrode 50. The gate electrode 50 faces the p-type base layer 13 via the gate insulating film 53. The n-type source layer 15 is provided between the p-type base layer 13 and the source electrode 30. The n-type source layer 15 is in contact with the gate insulating film 53.

Further, the gate electrode 50 includes a first control portion 50a and a second control portion 50b. The first control portion 50a and the second control portion 50b are arranged in a second direction parallel to the back surface 10B of the semiconductor part 10, for example, in an X-direction. For example, the first control portion 50a and the second control portion 50b are connected to each other (not shown). The first control portion 50a and the second control portion 50b are biased to have the same potential.

As shown in FIG. 1, the FP electrode 40 has an end portion 40e extending between the first and second control portions 50a and 50b of the gate electrode 50. The end portion 40e of the FP electrode 40 is electrically insulated from the gate electrode 50 by an inter-electrode insulating film 45 (third insulating film). The inter-electrode insulating film 45 covers the end portion 40e of the FP electrode 40.

The gate electrode 50 is provided between the FP insulating film 43 and the source electrode 30. The FP insulating film 43 includes an extending portion 43e extending between the end portion 40e of the FP electrode 40 and the gate electrode 50. The inter-electrode insulating film 45 is provided to extend between the end portion 40e of the FP electrode 40 and the extending portion 43e of the FP insulating film 43.

That is, the extending portion 43e of the FP insulating film 43 and the inter-electrode insulating film 45 are interposed between the end portion 40e of the FP electrode 40 and each of the first and second control portion 50a and 50b of the gate electrode 50. The FP electrode 40 is electrically insulated from the gate electrode 50 by two insulating films arranged in a direction from the end portion 40e toward the gate electrode 50. Thus, a dielectric breakdown voltage is increased between the FP electrode 40 and the gate electrode 50.

An interlayer insulating film 55 (fourth insulating film) is provided above the FP electrode 40 and the gate electrode 50. The interlayer insulating film 55 is provided between the semiconductor part 10 and the source electrode 30, between the FP electrode 40 and the source electrode 30, and between the gate electrode 50 and the source electrode 30. The interlayer insulating film 55 electrically insulates the gate electrode 50 from the source electrode 30.

The source electrode 30 includes a contact portion 30c that penetrates into the interlayer insulating film 55. The contact portion 30c is connected to the semiconductor part 10. The contact portion 30c extends into a contact hole provided in the interlayer insulating film 55.

The contact portion 30c of the source electrode 30 is in contact with the n-type source layer 15 and the p-type contact layer 17 and electrically connected thereto. The p-type contact layer 17 is provided between the p-type base layer 13 and the contact portion 30c. The p-type contact layer 17 contains a p-type impurity with a concentration higher than a concentration of a p-type impurity in the p-type base layer 13. The p-type base layer 13 is electrically connected to the source electrode 30 via the p-type contact layer 17.

The n-type buffer layer 19 is provided between the n-type drift layer 11 and the drain electrode 20. The n-type buffer layer 19 contains an n-type impurity with a concentration higher than a concentration of an n-type impurity in the n-type drift layer 11. The drain electrode 20 is electrically connected to the n-type drift layer 11 via the n-type buffer layer 19.

A manufacturing method of the semiconductor device 1 will be described below with reference to FIGS. 2A to 5C. FIGS. 2A to 5C are schematic cross-sectional views showing manufacturing processes of the semiconductor device 1 according to the embodiment.

For example, a silicon wafer 100 is used for manufacturing the semiconductor device 1. The silicon wafer 100 includes an n-type silicon substrate 101 and an n-type silicon layer 103. The n-type silicon layer 103 is epitaxially grown on, for example, the n-type silicon substrate 101. The n-type silicon layer 103 contains an n-type impurity with a concentration lower than a concentration of an n-type impurity in the n-type silicon substrate 101.

As shown in FIG. 2A, the gate trench GT is formed in the n-type silicon layer 103. The gate trench GT has an opening in a front surface 103F of the n-type silicon layer 103. The gate trench GT is formed using, for example, anisotropic reactive ion etching (RIE).

As shown in FIG. 2B, the FP insulating film 43 is formed on the n-type silicon layer 103. The FP insulating film 43 is formed to cover an inner surface of the gate trench GT. The FP insulating film 43 is formed so that a space SP1 remains inside the gate trench GT.

The FP insulating film 43 is formed using, for example, chemical vapor deposition (CVD) after thermal oxidation of the n-type silicon layer 103. The FP insulating film 43 is, for example, a silicon oxide film. The FP insulating film 43 includes, for example, a first silicon oxide film by the thermal oxidization and a second silicon oxide film deposited by CVD.

As shown in FIG. 2C, a conductive film 105 is formed on the FP insulating film 43. The space SP1 in the gate trench GT is formed with the conductive film 105. The conductive film 105 is, for example, a conductive polysilicon film. The conductive film 105 is formed using, for example, CVD.

Figure 3A:
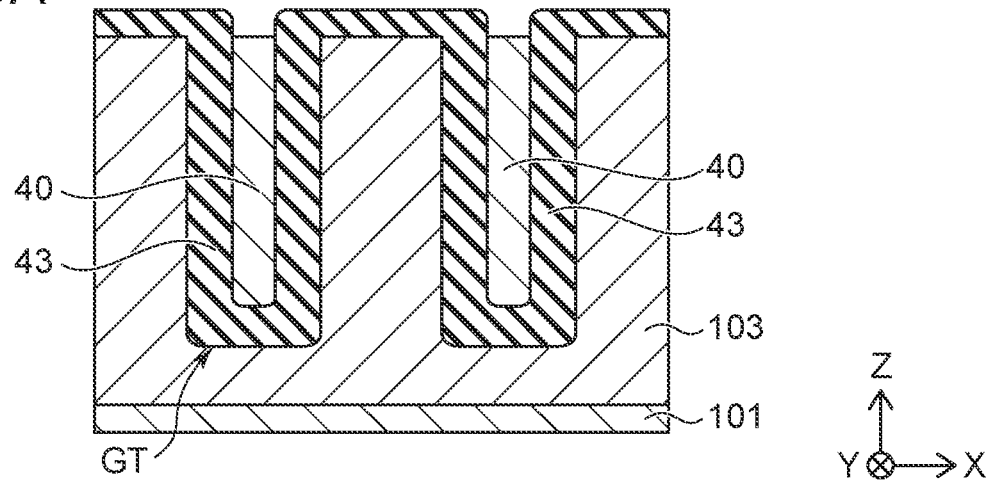

As shown in FIG. 3A, the FP electrode 40 is formed in the gate trench GT by partially removing the conductive film 105. The conductive film 105 is removed by, for example, isotropic dry etching. The conductive film 105 is removed leaving a portion provided in the gate trench GT.

Figure 3B:
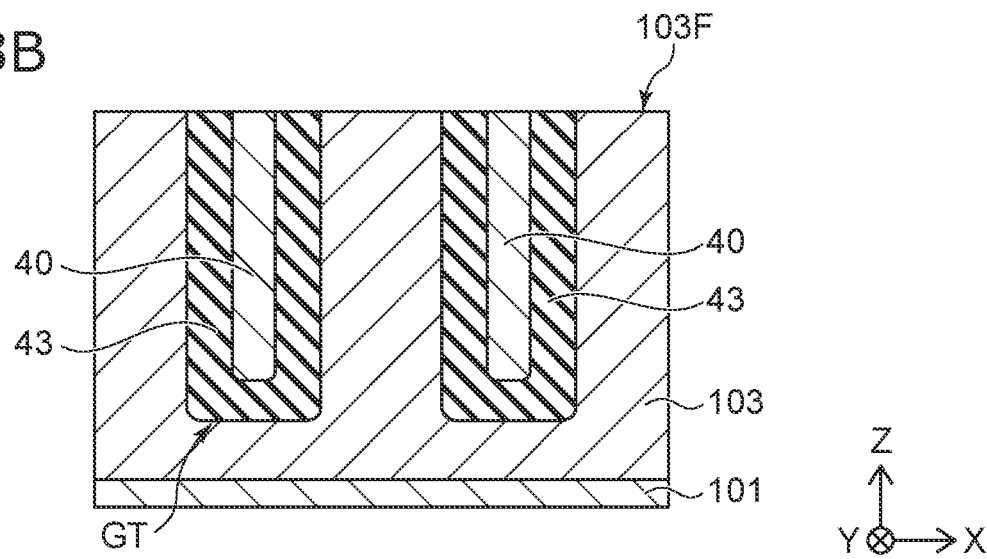

As shown in FIG. 3B, the FP insulating film 43 is partially removed to planarize a front surface 103F side of the n-type silicon layer 103 is. The FP insulating film 43 is removed using, for example, isotropic dry etching.

Figure 3C:
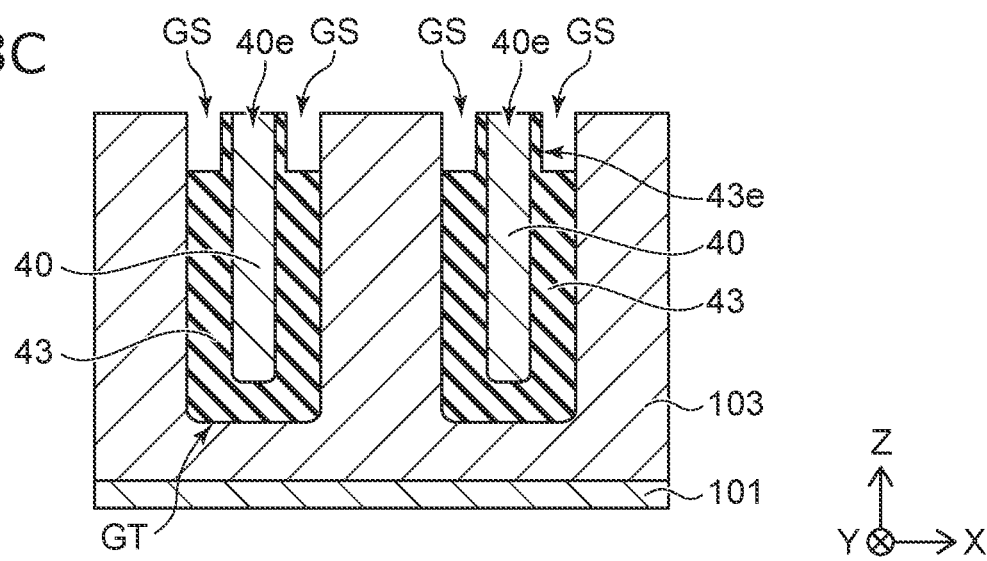

As shown in FIG. 3C, a gate space GS is formed by partially removing the FP insulating film 43. The FP insulating film 43 is removed by, for example, dry etching using an etching mask (not shown). The gate space GS is formed such that an inner wall is exposed at the upper portion of the gate trench GT. The gate space GS is formed respectively on both sides of the end portion 40e of the FP electrode 40. The extending portion 43e of the FP insulating film 43 remains between the gate space GS and the end portion 40e of the FP electrode 40. When the FP insulating film 43 has a two-layer structure of the thermal oxidized film and the deposited film, the extending portion 43e is a portion of the deposited film.

Figure 4A:
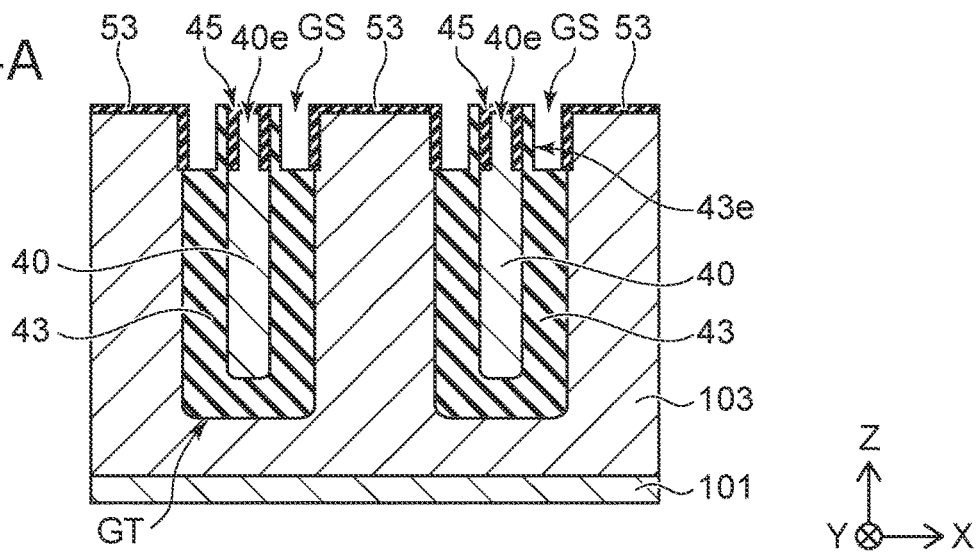

As shown in FIG. 4A, the inter-electrode insulating film 45 and the gate insulating film 53 are formed. The inter-electrode insulating film 45 and the gate insulating film 53 are formed by, for example, thermal oxidization. The gate insulating film 53 is formed by oxidizing an exposed surface of the n-type silicon layer 103. The inter-electrode insulating film 45 is formed by thermally oxidizing the end portion 40e of the FP electrode 40. At this time, the side surface of the end portion 40e is oxidized in addition to the exposed end of the FP electrode 40. The end portion 40e of the FP electrode 40 is oxidized by oxygen that is passed through the extending portion 43e of the FP insulating film 43. In other words, the extending portion 43e of the FP insulating film 43 is provided with a thickness through which the end portion 40e of the FP electrode 40 is oxidized. Accordingly, the inter-electrode insulating film 45 is provided to cover the end portion 40e of the FP electrode 40 and extend between the end portion 40e and the extending portion 43e of the FP insulating film 43.

The inter-electrode insulating film 45 and the gate insulating film 53 are, for example, silicon oxide films. The inter-electrode insulating film 45 has, for example, a film density different from a film density of the extending portion 43e of the FP insulating film 43. In other words, the inter-electrode insulating film 45 includes smaller number of dangling bonds of silicon atoms that are not bonded to oxygen than the number of dangling bonds of silicon atoms in the FP insulating film 43. Therefore, in TEM or SEM image of the cross-section, the brightness of the inter-electrode insulating film 45 is different from the brightness of the extending portion 43e of the FP insulating film 43. Moreover, when the FP insulating film 43 has a two-layer structure including the thermal oxide film and the deposited film, the brightness of the thermal oxide film is different from the brightness of the deposited film in the TEM or the SEM image of the cross-section thereof.

Figure 4B:
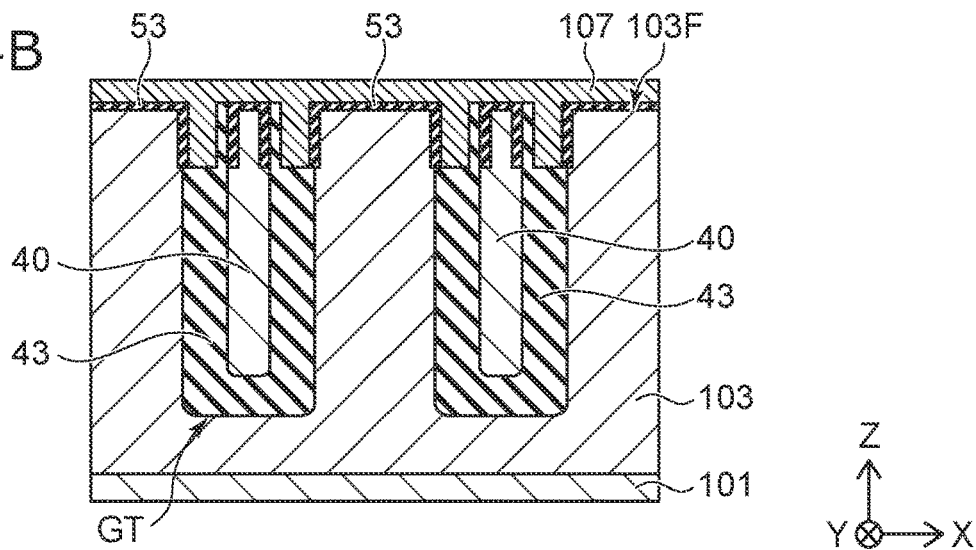

As shown in FIG. 4B, a conductive film 107 is formed on the front surface 103F side of the n-type silicon layer 103. The gate space GS is filled with the conductive film 107. The conductive film 107 is, for example, conductive polysilicon. The conductive film 107 is formed using, for example, CVD.

Figure 4C:
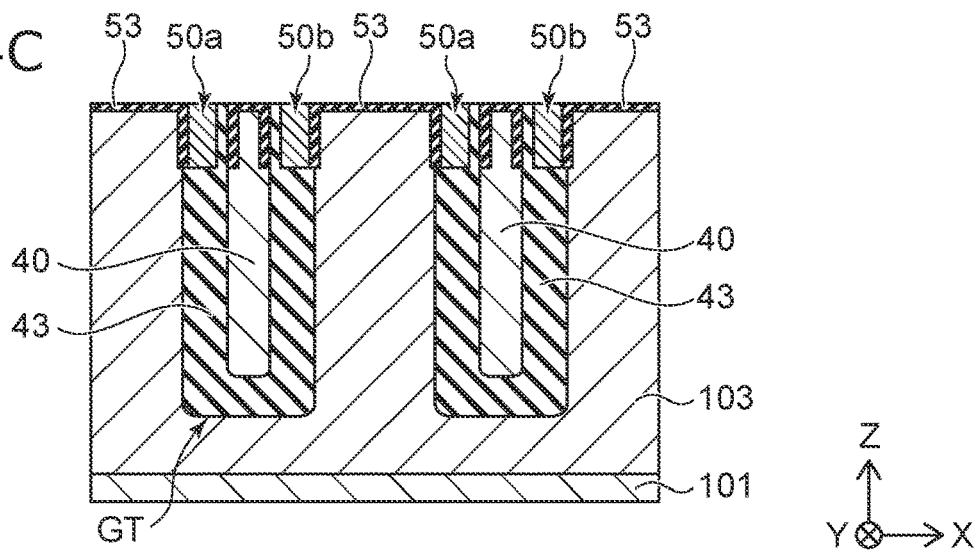

As shown in FIG. 4C, the conductive film 107 is removed so that a portion in the gate space GS remains. Accordingly, the first control portion 50a and the second control portion 50b of the gate electrode 50 are formed. The end portion 40e of the FP electrode 40 is positioned between the first control portion 50a and the second control portion 50b.

As shown in FIG. 5A, the p-type base layer 13 and the n-type source layer 15 are formed on the n-type silicon layer 103. The n-type source layer 15 is formed on the p-type base layer 13. The p-type base layer 13 is formed by ion-implanting a p-type impurity such as boron (B) into the n-type silicon layer 103 and by a heat treatment. The ion-implanted p-type impurity is activated by the heat treatment and diffuses into the n-type silicon layer 103. The n-type source layer 15 is formed by ion implanting an n-type impurity such as arsenic (As) into the p-type base layer 13 and activating the n-type impurity by a heat treatment. The heat treatment of n-type impurity is performed so as not to diffuse into the p-type base layer 13.

As shown in FIG. 5B, the interlayer insulating film 55 is formed on the front surface 103F side of the n-type silicon layer 103. The interlayer insulating film 55 is formed to cover the FP electrode 40 and the gate electrode 50. The interlayer insulating film 55 is, for example, a silicon oxide film. The interlayer insulating film 55 is formed using, for example, CVD.

Subsequently, a contact trench CT is formed above the n-type source layer 15. The contact trench CT has a depth capable of extending into the semiconductor part 10 from a surface of the interlayer insulating film 55. The contact trench CT, for example, is formed to have a depth capable of extending into the p-type base layer 13 through the n-type source layer 15.

As shown in FIG. 5C, the p-type contact layer 17 is formed on the p-type base layer 13, and then, the source electrode 30 is formed on the interlayer insulating film 55. The p-type contact layer 17 is formed by implanting a p-type impurity such as boron (B) into the semiconductor part 10 via the contact trench CT and activating the ion-implanted p-type impurity by performing a heat treatment. The source electrode 30 has a contact portion 30c extending into the contact trench CT. The contact portion 30c is in contact with the n-type source layer 15 and the p-type contact layer 17.

The source electrode 30 includes, for example, tungsten (W), aluminum (Al), titanium (Ti), or the like. The source electrode 30 includes, for example, a tungsten film that fills the contact trench CT, and an aluminum film formed on the tungsten film. The tungsten film is formed using, for example, CVD. The aluminum film is formed using, for example, a sputtering method.

Subsequently, the n-type silicon substrate 101 is thinned by grinding or etching at the back surface side thereof. The n-type silicon substrate 101 is thinned to be the n-type buffer layer 19. The n-type silicon layer 103 becomes the n-type drift layer 11. Further, the drain electrode 20 is formed on the back surface side of the n-type buffer layer 19, and the semiconductor device 1 is completed. The drain electrode 20 is formed using, for example, the sputtering method, and includes titanium (Ti), nickel (Ni), or the like.

The manufacturing method described above is an example, and the embodiment is not limited thereto. For example, the FP insulating film 43 and the inter-electrode insulating film 45 may be insulating films other than silicon oxide films. The FP insulating film 43 may be an insulating film different in a composition from the inter-electrode insulating film 45.

Figure 6:
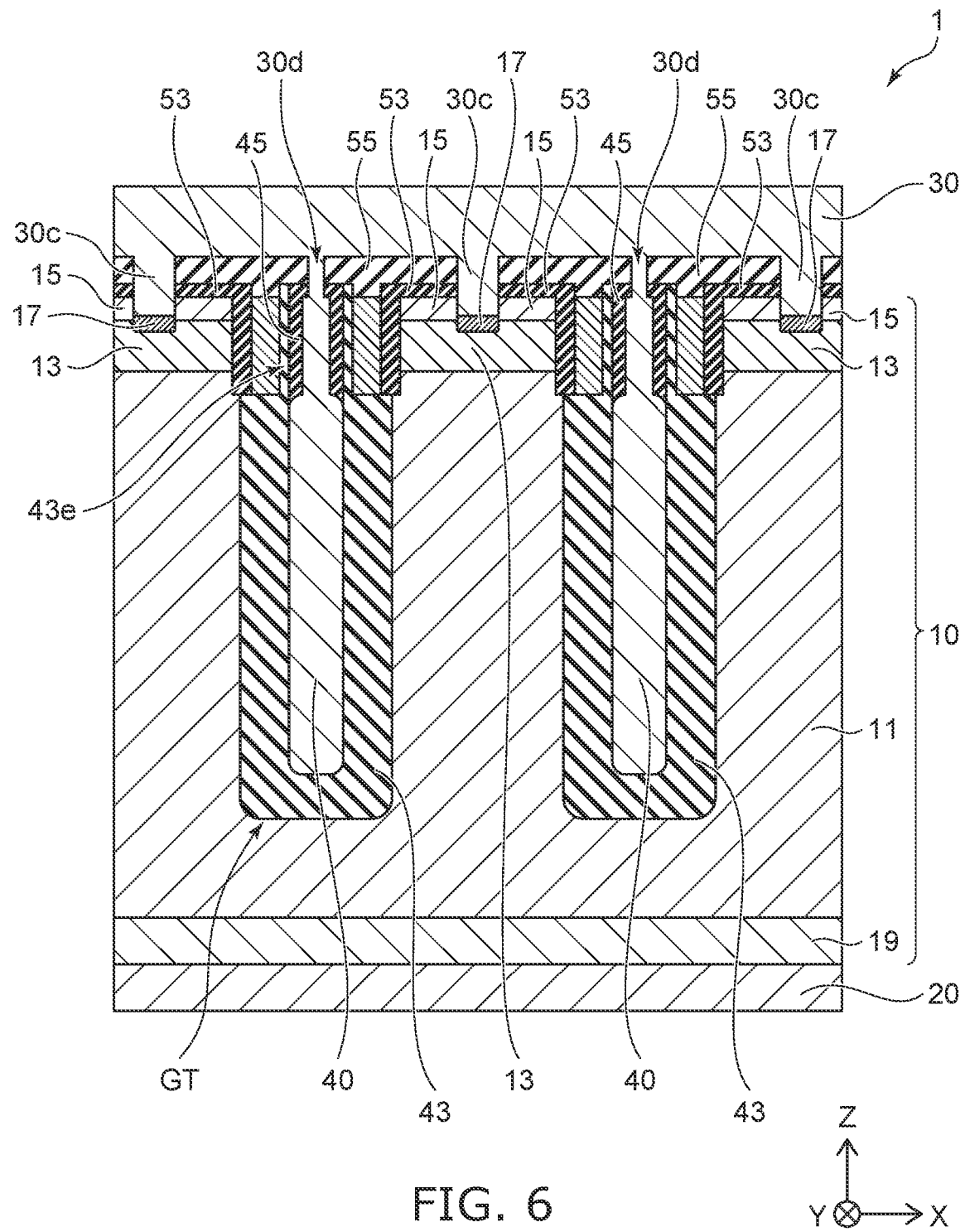
FIG. 6 is another schematic cross-sectional view showing the semiconductor device according to the embodiment.

FIG. 6 is another schematic cross-sectional view showing the semiconductor device 1 according to the embodiment.

As shown in FIG. 6, the source electrode 30 further includes, for example, a contact portion 30d. The contact portion 30d is formed in, for example, a contact hole provided in the inter-electrode insulating film 45 and the interlayer insulating film 55. The contact portion 30d is connected to the FP electrode 40. The FP electrode 40 is electrically connected to the source electrode 30 via the contact portion 30d. Thus, the FP electrode 40 has the same potential as a potential of the source electrode 30.

Figure 7:
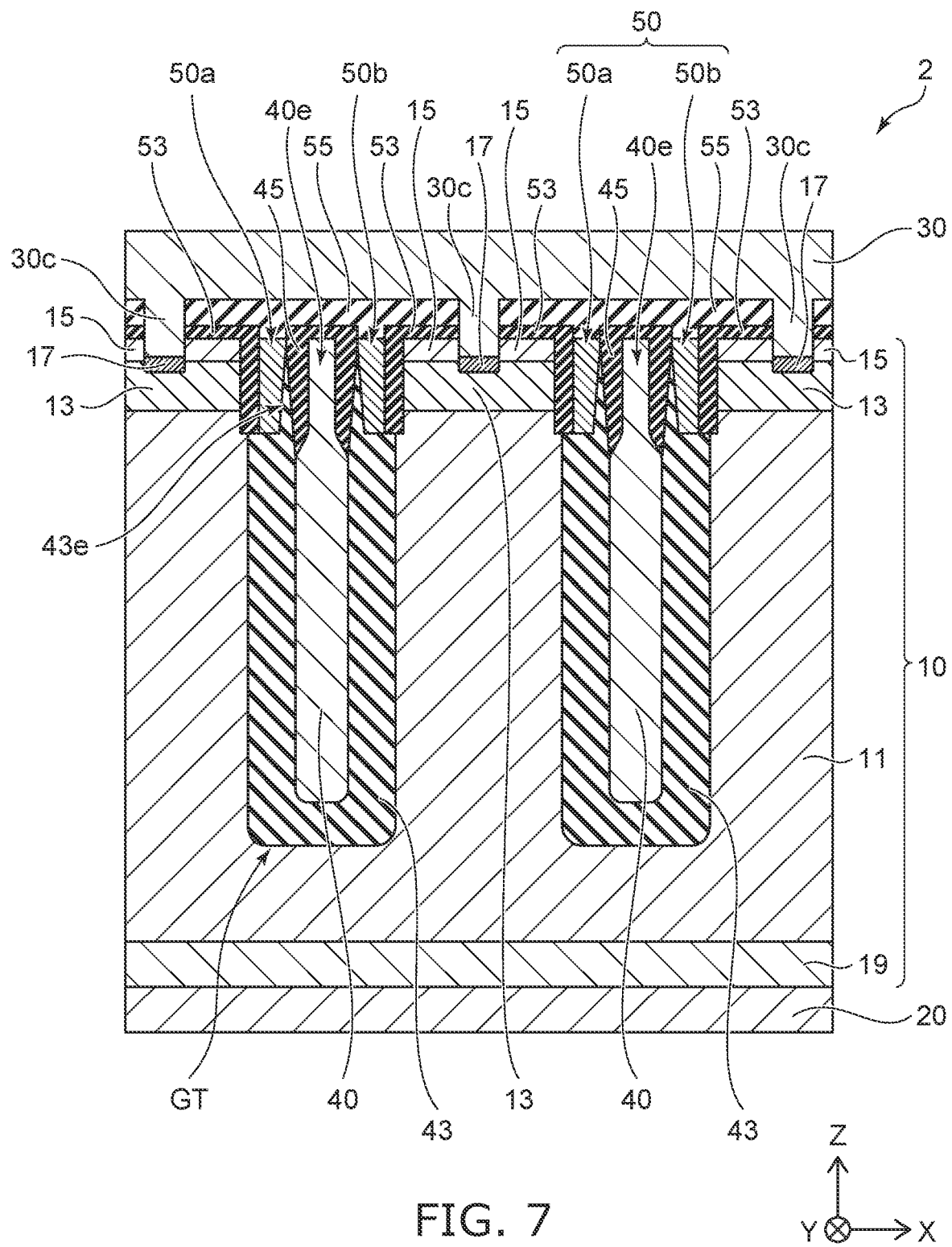
FIG. 7 is a schematic cross-sectional view showing a semiconductor device according to a variation of the embodiment.

FIG. 7 is a schematic cross-sectional view showing a semiconductor device 2 according to a variation of the embodiment. In this example, the FP electrode 40 also has the end portion 40e extending between the first control portion 50a and the second control portion 50b of the gate electrode 50. Moreover, the FP electrode 40 is electrically connected to the source electrode 30 (not shown).

The FP insulating film 43 includes the extending portion 43e extending between the end portion 40e of the FP electrode 40 and the gate electrode 50. The extending portion 43e has, for example, a first film thickness in the X-direction at a tip end in the Z direction, and a second film thickness in the X-direction between a lower end of the gate electrode 50 and the FP electrode 40. The lower end of the gate electrode 50 in contact with the FP insulating film 43.

The extending portion 43e is provided so that the first film thickness is smaller than the second film thickness.

An upper end of the gate electrode 50 that faces the interlayer insulating film 55 is in contact with the inter-electrode insulating film 45. The inter-electrode insulating film 45 has a third film thickness in the X-direction at a portion in contact with the gate electrode 50. The inter-electrode insulating film 45 also has a fourth film thickness in the X-direction at another portion facing the lower end of the gate electrode 50 via the extending portion 43e of the FP insulating film 43. The third film thickness is larger than the fourth film thickness.

In this example, a dielectric breakdown voltage can also be increased between the FP electrode 40 and the gate electrode 50 by providing an insulating film having a two-layer structure of the extending portion 43e of the FP insulating film 43 and the inter-electrode insulating film 45 between the end portion 40e of the FP electrode 40 and the gate electrode 50. Accordingly, it is possible to improve the reliability of the trench gate electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
    a semiconductor part;
    a first electrode provided on a back surface of the semiconductor part;
    a second electrode provided on a front surface of the semiconductor part, the front surface of the semiconductor part being at a side of the semiconductor part that is opposite to the back surface of the semiconductor part;
    a third electrode provided between the first electrode and the second electrode, the semiconductor part including a trench having an opening in the front surface of the semiconductor part, and the third electrode extending inside the trench in a first direction from the first electrode toward the second electrode;
    a control electrode provided inside the trench at the opening of the trench, the control electrode including a first control portion and a second control portion arranged in a second direction parallel to the back surface of the semiconductor part, the third electrode having a front end portion on a side of the third electrode that is closest to the front surface of the semiconductor part, and the front end portion of the third electrode extending between the first control portion and the second control portion;
    a first insulating film provided between the semiconductor part and the third electrode, the first insulating film electrically insulating the third electrode from the semiconductor part;
    a second insulating film provided between the semiconductor part and the control electrode, the second insulating film electrically insulating the control electrode from the semiconductor part; and
    a third insulating film covering the front end portion of the third electrode, the third insulating film electrically insulating the third electrode from the control electrode and from the second electrode,
    the control electrode being provided between the first insulating film and the second electrode,
    the first insulating film including an extending portion extending between the front end portion of the third electrode and the control electrode,
    the third insulating film extending between the extending portion of the first insulating film and the front end portion of the third electrode, and
    the third insulating film extending between the front end portion of the third electrode and the second electrode.

2. A semiconductor device comprising:
    a semiconductor part;
    a first electrode provided on a back surface of the semiconductor part;
    a second electrode provided on a front surface of the semiconductor part, the front surface of the semiconductor part being at a side of the semiconductor part that is opposite to the back surface of the semiconductor part;
    a third electrode provided between the first electrode and the second electrode, the semiconductor part including a trench having an opening in the front surface of the semiconductor part, and the third electrode extending inside the trench in a first direction from the first electrode toward the second electrode;
    a control electrode provided inside the trench at the opening of the trench, the control electrode including a first control portion and a second control portion arranged in a second direction parallel to the back surface of the semiconductor part, and the third electrode having an end portion extending between the first control portion and the second control portion;
    a first insulating film provided between the semiconductor part and the third electrode, the first insulating film electrically insulating the third electrode from the semiconductor part;
    a second insulating film provided between the semiconductor part and the control electrode, the second insulating film electrically insulating the control electrode from the semiconductor part; and
    a third insulating film covering the end portion of the third electrode, the third insulating film electrically insulating the third electrode from the control electrode,
    the control electrode being provided between the first insulating film and the second electrode,
    the first insulating film including an extending portion extending between the end portion of the third electrode and the control electrode,
    the third insulating film extending between the extending portion of the first insulating film and the end portion of the third electrode,
    the control electrode including a first end portion at a side of the control electrode facing the second electrode and a second end portion at a side of the control electrode facing the first insulating film,
    the first end portion of the control electrode being in contact with the third insulating film, and
    the second end portion of the control electrode being in contact with the first insulating film.

3. The semiconductor device according to claim 1, wherein
    the first insulating film has a two-layer structure including an oxidized film provided by thermally oxidizing the semiconductor part and a deposited film provided on the oxidized film, and the extending portion of the first insulating film is a portion of the deposited film.

4. The semiconductor device according to claim 3, wherein
the semiconductor part is silicon, and
the oxidized film and the deposited film of the first insulating film are silicon oxide films.

5. The semiconductor device according to claim 1, wherein
the third electrode is polysilicon, and
the third insulating film is a silicon oxide film provided by thermally oxidizing the third electrode.

6. The semiconductor device according to claim 2, wherein
the extending portion of the first insulating film has a first film thickness, which is at a tip end thereof in the first direction, and a second film thickness that is equal to a distance from the second end portion of the control electrode to the third electrode, and
the first film thickness is smaller than the second film thickness.

7. The semiconductor device according to claim 2, wherein
the third insulating film includes a first portion in contact with the first end portion of the control electrode and a second portion facing the second end portion of the control electrode and the extending portion of the first insulating film, and
the first portion of the third insulating film has a third film thickness in the second direction larger than a fourth film thickness in the second direction of the second portion of the third insulating film.

8. The semiconductor device according to claim 1, further comprising:

a fourth insulating film provided between the second electrode and the control electrode, the fourth insulating film electrically insulating the control electrode from the second electrode.

9. The semiconductor device according to claim 8, wherein
the fourth insulating film extends between the second electrode and the third electrode.

10. The semiconductor device according to claim 1, wherein
the semiconductor part includes first to third layers,
the first layer being of a first conductivity type, the first layer extending between the first electrode and the second electrode, and the first layer facing the third electrode and the first insulating film,
the second layer being of a second conductivity type, the second layer being provided between the first layer and the second electrode, and the second layer facing the control electrode and the second insulating film, and
the third layer being of the first conductivity type, the third layer being provided between the second layer and the second electrode, and the third layer being in contact with the second insulating film.

11. The semiconductor device according to claim 10, wherein
the semiconductor part further includes a fourth layer of the second conductivity type, the fourth layer being provided between the second layer and the second electrode, and the fourth layer including a second conductivity type impurity with a higher concentration than a concentration of a second conductivity type impurity in the second layer, and
the second electrode includes a first contact portion in contact with the third layer and the fourth layer, the second electrode being electrically connected to the third layer and the fourth layer.

* * * * *